United States Patent [19]
Hasegawa et al.

[11] Patent Number: 5,554,249
[45] Date of Patent: Sep. 10, 1996

[54] MAGNETRON PLASMA PROCESSING SYSTEM

[75] Inventors: Makoto Hasegawa, Kawasaki; Tsuyoshi Saito; Fumihiko Higuchi, both of Tokyo; Hideaki Amano, Zama; Katsunori Naitoh, Yamanashi-ken; Takashi Tozawa, Yamanashi-ken; Tatsuya Nakagome, Yamanashi-ken; Keiki Ito, Nirasaki; Kouji Suzuki, Yamanashi-ken, all of Japan

[73] Assignee: Tokyo Electron Limited, Tokyo, Japan

[21] Appl. No.: 395,303

[22] Filed: Feb. 28, 1995

[30] Foreign Application Priority Data

Feb. 28, 1994 [JP] Japan ................................. 6-054671
Oct. 28, 1994 [JP] Japan ................................. 6-289266

[51] Int. Cl.$^6$ .......................... H01L 21/00; C23C 14/34; C23C 16/00
[52] U.S. Cl. .................. 156/345; 118/719; 118/723 MR; 118/723 MA; 118/723 E; 204/298.16; 204/298.2; 204/298.25; 204/298.37
[58] Field of Search ........................... 156/345; 118/719, 118/723 R, 723 MR, 723 MA, 723 E; 204/298.16, 298.2, 298.25, 298.33, 298.33, 298.37, 298.07, 298.05

[56] References Cited

U.S. PATENT DOCUMENTS

| | | | |
|---|---|---|---|
| 4,825,808 | 5/1989 | Takahashi et al. | 118/723 MR |
| 5,203,945 | 4/1993 | Hasegawa et al. | 156/345 |
| 5,270,266 | 12/1993 | Hirano et al. . | |
| 5,376,211 | 12/1994 | Harada et al. | 204/298.16 |
| 5,387,893 | 2/1995 | Oguriyama et al. . | |

*Primary Examiner*—Nam Nguyen
*Assistant Examiner*—Rodney G. McDonald
*Attorney, Agent, or Firm*—Oblon, Spivak, McClelland, Maier, & Neustadt, P.C.

[57] ABSTRACT

A magnetron plasma etching system has a plurality of processing chambers connected to a common transfer chamber. Each processing chamber has a pair of counter electrodes for generating an electric field and a magnet mechanism for generating a magnetic field having an N-S axis crossing the electric field. All magnetic fields are rotated in the same plane. The rotation of the magnetic fields is controlled by a controller. When one of the magnetic fields is rotated, the other magnetic fields are rotated at equal speed such that the directions of N-S axes thereof are parallel and identical to that of the one of the magnetic fields.

20 Claims, 8 Drawing Sheets

MAGNETRON PLASMA PROCESSING SYSTEM

BACKGROUND OF THE INVENTION

1. Field of the Invention

The present invention relates generally to a magnetron plasma processing system and more particularly to a magnetron processing system having a plurality of plasma processing chambers in which rotating magnetic fields are generated.

2. Description of the Related Art

An example of a conventionally known system for subjecting semiconductor wafers or LCD substrates to an etching process or a film forming process is a so-called "cluster tool type" system wherein a plurality of processing chambers are connected to a transfer chamber. In a cluster tool type system wherein a high-density plasma for performing RIE (reactive ion etching) is generated by making use of, for example, magnetron discharge, a plurality of vacuum processing chambers are connected to a common transfer chamber in which a reduced-pressure atmosphere can be created. A pair of counter electrodes are provided within each processing chamber and a high-frequency electric field is created. A magnet mechanism is provided on top of or around each processing chamber, and a magnetic field of about 100 to 200 Gauss (G), which crosses the aforementioned electric field, is generated. Each magnetic field is rotated in order to enhance in-plane uniformity of processing on a target substrate.

In the above RIE system, however, the magnetic field in each processing chamber is disturbed due to influence of the magnetic field existing in the vicinity of each processing chamber, and consequently the density of a produced plasma varies and becomes non-uniform. In addition, noise is produced by the influence of the leak magnetic field from the system. Specifically, noise occurs in various electronic devices disposed near the system, in particular, devices having magnetic fields. For example, an image on an electronic microscope is disturbed. These problems occur not only in the RIE system, but also in other processing systems such as CVD systems or sputtering systems each having a plurality of processing chambers making use of magnetron discharge.

SUMMARY OF THE INVENTION

An object of the present invention is to provide a magnetron plasma processing system having a plurality of processing chambers, wherein variation or non-uniformity in plasma density due to disturbance of magnetic field in each processing chamber can be prevented.

Another object of the invention is to provide a magnetron plasma processing system having a plurality of processing chambers, wherein noise is prevented from occurring in various peripheral electronic devices due to leak magnetic field from the system.

The inventors studied the disturbance of magnetic field in each processing chamber in this type of system and found that the greatest factor of the disturbance is irregular interference due to a leak component of magnetic field in each processing chamber. In addition, they studied the leak magnetic field of this type of system and found that leak components of magnetic fields in the respective processing chambers are compounded, resulting in greater leak magnetic field, irregular behavior of leak field, and adverse affect on peripheral electronic devices.

To solve these problems, there is an idea that each processing chamber or the entire system is shielded by a magnetic field shield member of soft iron, etc. However, this means is not desirable from the standpoint of manufacturing cost of the system. If the distance between the processing chambers is increased, the influence of leak magnetic field component from adjacent processing chambers can be reduced, but this technique is undesirable in consideration of the total size of the system.

According to the present invention, there is provided a system for processing a target surface to be processed of a substrate by using a plasma, the system comprising:

a container defining a vacuum processing space for storing and processing the substrate;

a supply system for introducing a gas into the container, the gas being to be made into a plasma;

an exhaust system for exhausting the container; a pair of counter electrodes facing each other within the container;

a support member, disposed within the container, for supporting the substrate such that the target surface is exposed to the processing space;

a power supply for applying a voltage between the counter electrodes, thereby generating an electric field;

a first magnet mechanism for generating a first magnetic field between the counter electrodes, the first magnetic field having an N-S axis crossing the electric field and rotating;

a second magnet mechanism for generating a second magnetic field having a rotating N-S axis, the first and second magnetic fields having parallel rotational planes; and a controller for controlling the first and second magnet mechanisms with respect to rotation of the first and second magnetic fields, the controller rotating, when one of the first and second magnetic fields is rotated, the other at equal speed.

Typically, the second magnetic field, too, is generated to cross an electric field in another container defining a vacuum processing space. The first and second magnetic fields can be rotated at equal speed such that the directions of N-S axes thereof are parallel and identical or opposite to each other. It is desirable that the rotational planes of the first and second magnetic fields be located in the same plane.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
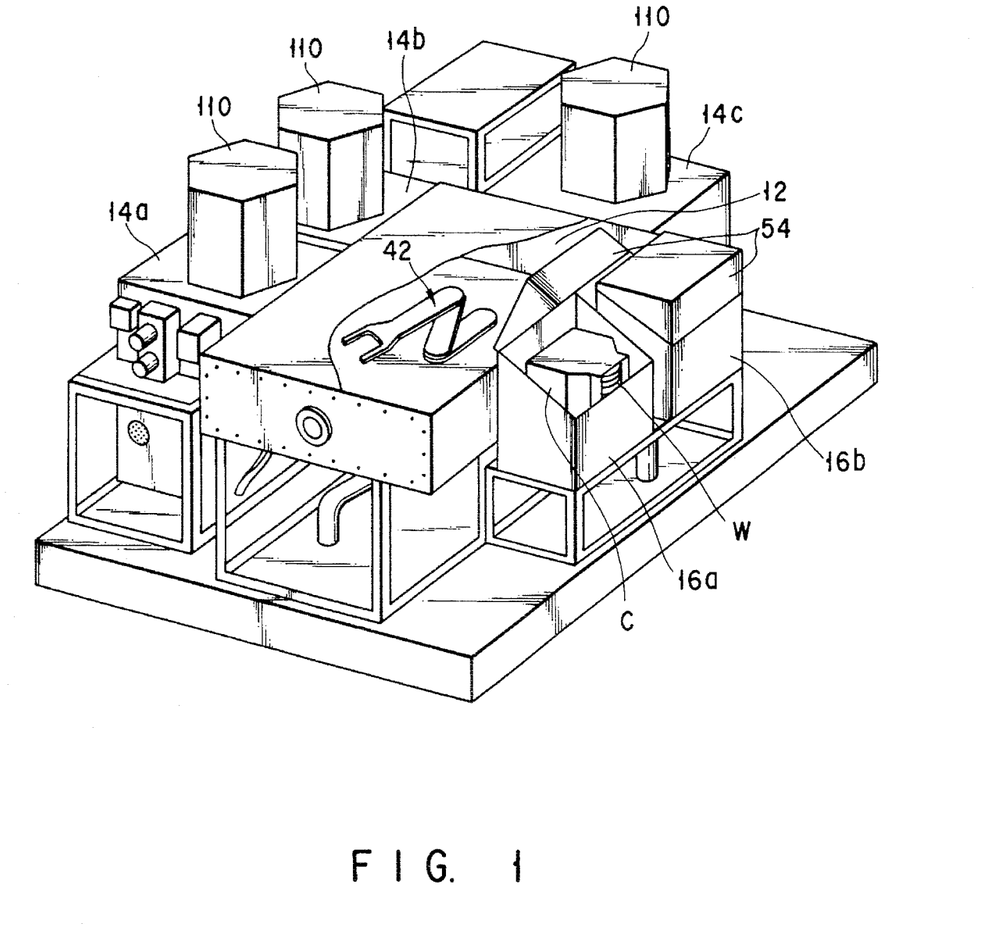
FIG. 1 is a perspective view showing schematically a system according to a first embodiment of the present invention.
Figure 2:
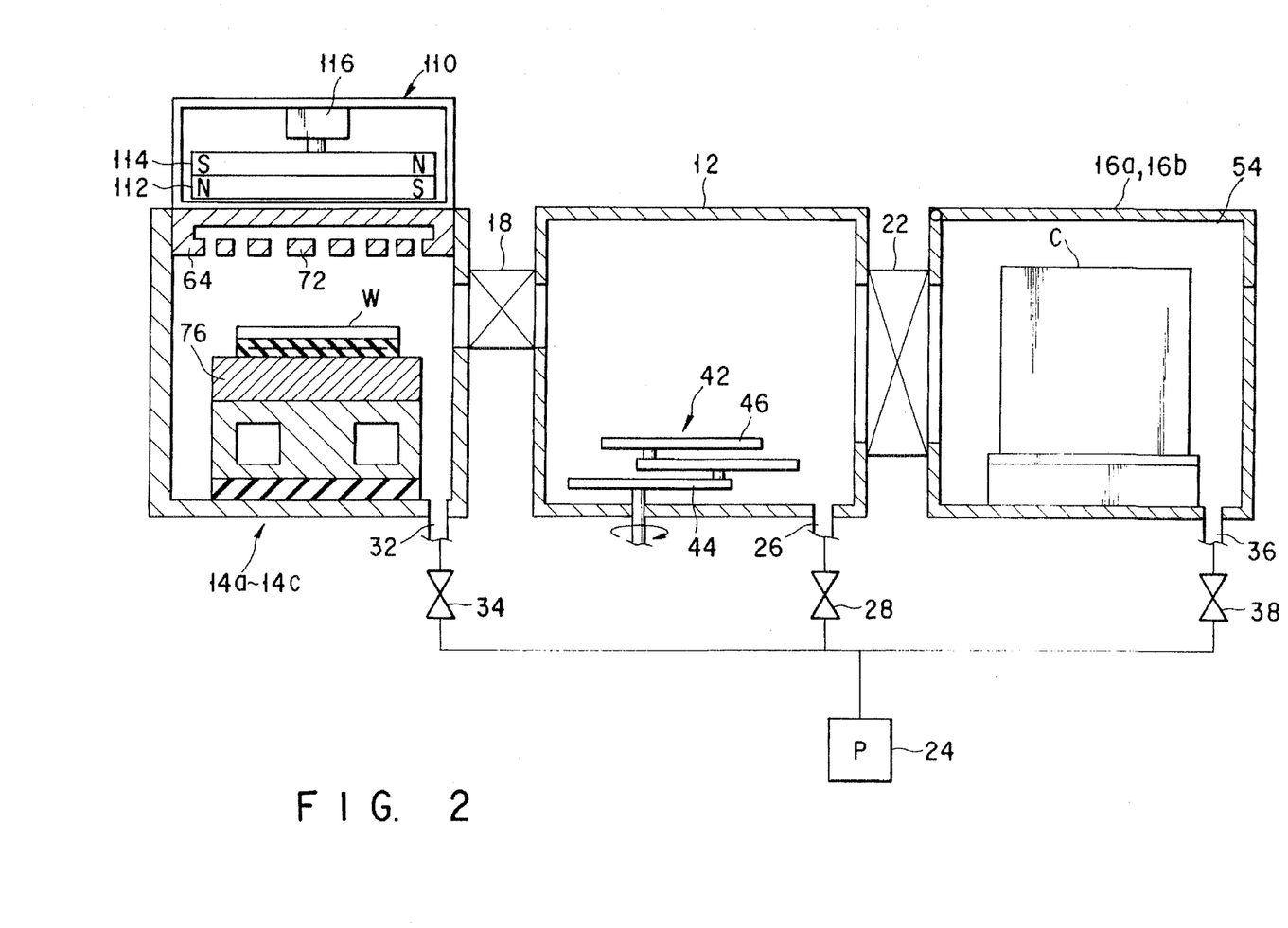
FIG. 2 is a cross-sectional view showing the relationship between a transfer chamber, one processing chamber and one cassette chamber of the system as shown in FIG. 1.

In a magnetron RIE system according to a first embodiment of the invention as shown in FIG. 1, three vacuum processing chambers 14a to 14c for performing etching are connected to a common transfer chamber 12 in which a reduced-pressure atmosphere can be created. Two cassette chambers 16a and 16b for storing wafers in units of a cassette are connected to the transfer chamber 12. FIG. 2 shows schematically the relationship between the transfer chamber 12, one of the processing chambers 14a to 14c and one of the cassette chambers 16a and 16b. A connection passage between the transfer chamber 12 and each of the processing chambers 14a to 14c is opened and closed by a gate valve 18. A connection passage between the transfer chamber 12 and each of the cassette chambers 16a and 16b is opened and closed by a gate valve 22.

By closing the gate valves 18 and 22, the transfer chamber 12, each of the processing chambers 14a to 14c, and each of the cassette chambers 16a and 16b can constitute independent sealed spaces. The transfer chamber 12, each of the processing chambers 14a to 14c, and each of the cassette chambers 16a and 16b are independently exhausted by a common exhaust device 24 such as a turbo molecular pump or a dry pump, so that a reduced-pressure atmosphere of, e.g. $10^{-5}$ Torr to $10^{-1}$ Torr can be created therein. An exhaust line 26 of the transfer chamber 12 is opened and closed by a valve 28. An exhaust line 32 of each of the processing chambers 14a to 14c is opened and closed by a valve 34. An exhaust line 36 of each of the cassette chambers 16a and 16b is opened and closed by a valve 38.

A transfer device 42 for transferring wafers is disposed within the transfer chamber 12. In this embodiment, the transfer device 42 is constituted by a multi-joint arm device having a vertically movable, rotatable base plate 44 and an extendible transfer arm 46 attached thereon. The surface of the transfer arm 46 is coated with electrically conductive Teflon for preventing static electricity. In addition, an alignment stage 48 for aligning wafers before introducing them into each of the processing chambers 14a to 14c, and a buffer stage 52 for staying wafers are provided within the transfer chamber 12 (see FIG. 4).

The cassette chambers 16a and 16b have substantially the same structure. For example, one of them may be used for taking in wafers, while the other used for taking out wafers. Alternatively, each may be used for taking in and out wafers.

Each of the cassette chambers 16a and 16b has an opening at a top portion thereof for taking in and out a wafer cassette C. The opening is opened and closed by a swingably cover 54 which can close the opening airtightly. A predetermined number of wafers W or target substrates, e.g. 25 wafers, are stored in each cassette C at vertical intervals. Wafers W are taken out of and in each cassette C one by one by the transfer device 42 provided within the transfer chamber 12.

In the present etching system, the processing chambers 14a to 14c have substantially the same structure so that a plurality of wafers W may be subjected to the same process in parallel.

Figure 3:
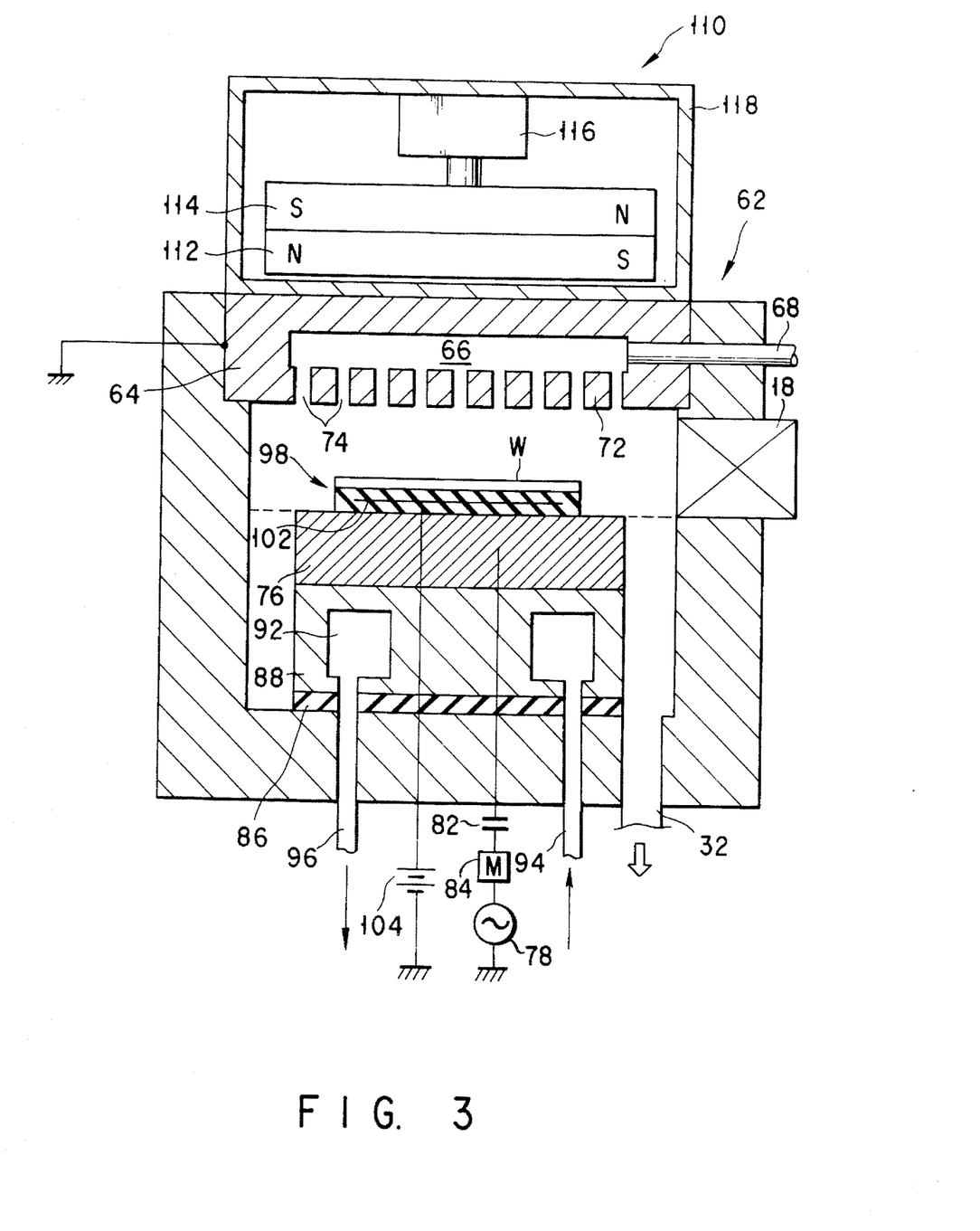
FIG. 3 is a cross-sectional view showing the processing chamber of the system as shown in FIG. 1.

As is shown in FIG. 3, each of the processing chambers 14a to 14c comprises an electrically conductive, airtight container 62 which defines a processing space for containing and processing the wafer W. The side walls and bottom wall of the container 62 are formed of an electrically conductive material, e.g. aluminum subjected to alumite surface treatment. The top wall of the container 62 is constituted by a gas supply head 64 formed of an electrically conductive material such as amorphous carbon, SiC, or aluminum subjected to alumite surface treatment. The head 64 has a recess 66 for temporarily receiving a processing gas such as an etching gas. The recess 66 is connected to gas supply sources via an introducing pipe 68. A lower part of the head 64 is formed as a diffusion plate 72 having many diffusion holes 74. The processing gas in the recess 66 is uniformly supplied to the wafer W through the diffusion holes 74.

A susceptor 76 is provided at a center region of the container 62. The susceptor 76 supports the wafer W so that the wafer W faces the diffusion plate 72 of the head 64. The susceptor 76 is formed of an electrically conductive material, e.g. aluminum subjected to alumite surface treatment. The diffusion plate 72 of the head 64 and the susceptor 76 function as parallel plate type upper and lower electrodes. In the present embodiment, the lower electrode or susceptor 76 is connected to a high-frequency power supply 78 via a capacitor 82 and a matching circuit 84, and the upper electrode or diffusion plate 72 is grounded. A high-frequency voltage of, e.g. 13.56 MHz is applied by the power supply 78 between the upper and lower electrodes 72 and 76. Thereby, an electric field formed of substantially vertical lines of electric force is generated between the upper and lower electrodes 72 and 76.

The susceptor 76 is placed on the bottom of the container 62 in an insulated state with a plate 86 of an insulating material such as ceramics and a support table 88 of a highly thermal conductive material interposed therebetween. A space 92 is formed within the support table 88. The space 92 is connected to an introducing pipe 94 and an exhaust pipe 96 which penetrate the bottom wall of the container 62 airtightly. The introducing pipe 94 and exhaust pipe 96 are connected to an apparatus (not shown) for supplying a coolant such as liquid nitrogen. The coolant for cooling the susceptor 76 and wafer w is circulated through the pipes 94 and 96 and space 92.

An electrostatic chuck 98 for attracting and holding the wafer W by Coulomb force is disposed on the upper surface of the susceptor 76. The electrostatic chuck 98 has a structure wherein an electrically conductive layer 102 of, e.g. electrolytic foil copper is sandwiched by upper and lower insulating layers of polyimide films, etc. The electrically conductive layer 102 is connected to a DC power supply 104 provided outside the container 62. For example, a DC voltage of 2.0 kV is applied to the conductive layer 102.

A magnetic field generating unit 110 is provided on the container 62. The unit 110 has a main magnet 112 for generating a magnetic field of 10 to 1000 Gauss within the container 62, which field intersects, ideally at right angles, with the electric field between the upper and lower electrodes 72 and 76. A sub-magnet 114 for preventing leak of magnetic field is provided on the main magnet 112 such that the polarity of the sub-magnet 114 is reverse to that of the main magnet 112. In the present embodiment, the magnets 112 and 114 are constituted by regular permanent magnets having equal magnetic force. The magnets 112 and 114 are vertically placed on each other and fixed. The magnets 112 and 114 are rotated as one unit about a vertical axis by a motor 116. The motor 116 is fixed on a top plate of a casing 118 for containing the magnets 112 and 114.

Figure 4:
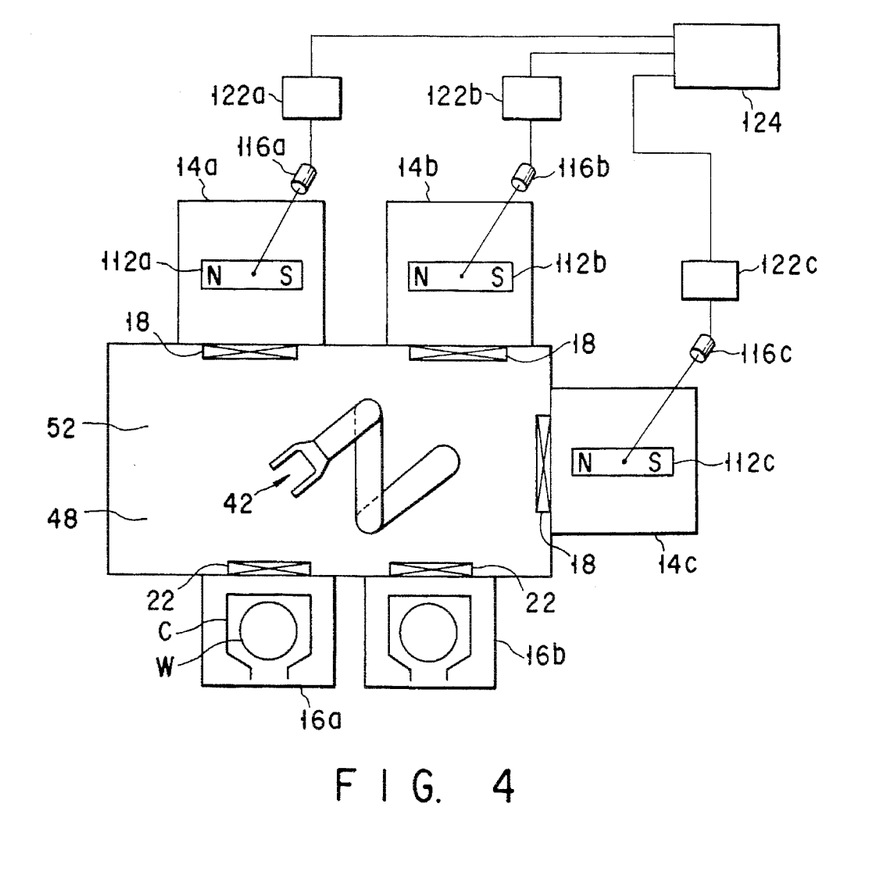
FIG. 4 is a plan view showing schematically the system as shown in FIG. 1.

In FIG. 4, the main magnet 112 and motor 116 are denoted by numerals 112a to 112c and 116a to 116c corresponding to the respective processing chambers 14a to 14c. The motors 116a to 116c are connected to driving circuits 122a to 122c which are in turn connected to a controller 124. Sync signals are output from the controller 124 to the driving circuits 122a to 122c. In response to the sync signals, the driving circuits 122a to 122c rotate forcibly the motors 116a to 116c at an equal speed, e.g. 20 rpm, in synchronism.

Figure 5:
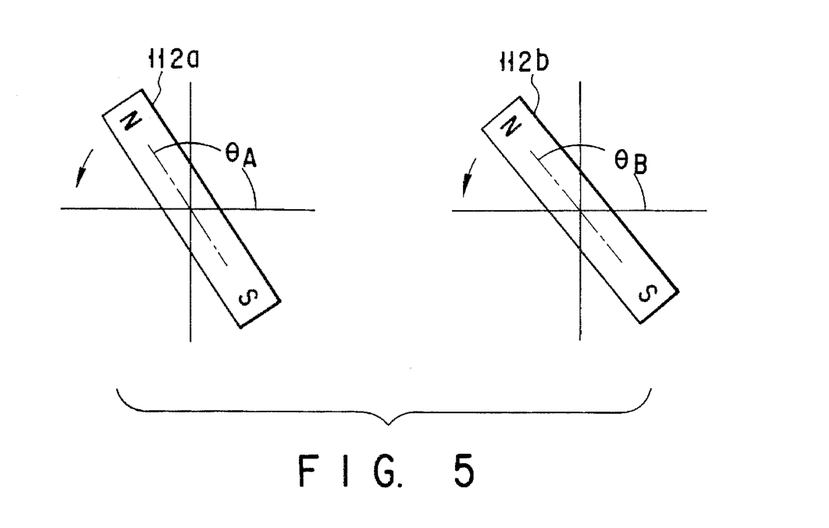
FIG. 5 illustrates synchronous rotation of magnetic fields of the system as shown in FIG. 1.

As is shown in FIGS. 4 and 5, the main magnets 112a to 112c are initially set such that N-S axes of magnetic fields are parallel in the same plane. Since the main magnets 112a to 112c are synchronously rotated in the same plane at equal speed., the N-S axes of the magnetic fields thereof are always parallel in the same plane.

A process for etching the wafer W by the system of the present embodiment will now be described.

At first, the cassette C containing 25 wafers W is put in the cassette chamber 16a and the cover 54 thereof is closed. Then, the exhaust valve 38 of the cassette chamber 16a is opened and the pressure within the cassette chamber 16a is reduced by the exhaust device 24 to, e.g. $10^{-1}$ Torr. If the cassette chamber 16a is used for loading wafers W and the other cassette chamber 16b is used for unloading wafers W, empty cassette C is introduced into the cassette chamber 16b. If each of the cassette chambers 16a and 16b is used for loading and unloading the wafers W, the cassette C containing 25 wafers W is also introduced into the cassette chamber 16b.

Subsequently, the gate valve 22 associated with the cassette chamber 16a is opened, and the transfer device 42 takes out a predetermined number of wafers W one by one from the cassette C and brings them into the transfer chamber 12. Following this, the gate valve 22 is closed and the exhaust valve 28 associated with the transfer chamber 12 is opened, so that the pressure within the transfer chamber 12 is reduced by the exhaust device 24 to, e.g. $10^{-3}$ Torr.

Then, the gate valve(s) 18 associated with selected one or more of the processing chambers 14a to 14c is(are) opened, and one wafer W is introduced by the transfer device 42 into each of the container(s) 62 of selected one(s) of the processing chambers 14a to 14c. The wafer W is mounted on the electrostatic chuck 98. After the transfer device 42 is retreated into the transfer chamber 12, the gate valve 18 is closed and a DC voltage is applied from the power supply 104. Thus, the wafer W is attracted and held on the electrostatic chuck 98.

Thereafter, the exhaust valve(s) 34 of selected one or more of the processing chambers 14a to 14c is(are) opened, and the pressure within the container 62 is reduced by the exhaust device 24. At the same time, a processing gas, for example, an etching gas such as $CF_4$ gas, is supplied from the introducing pipe 68 into the container 62 via the head recess 66 and diffusion holes 74. Thus, the pressure within the container 62 is set and kept at, e.g. $10^{-5}$ Torr.

Then, the magnet 112 is rotated and a rotating magnetic field is generated, such that it has an intensity of, e.g. 100 Gauss near the center of the wafer W. At the same time, a high-frequency power of 13.56 MHz is applied from the power supply 78 between the upper and lower electrodes 72 and 76. Thereby, the processing gas is made into a plasma between the upper and lower electrodes, and reactive ions in the plasma are accelerated and let to impinge upon the wafer W, thus effecting anisotropic etching. However, since the high-frequency power supply 78 is connected to the upper electrode 72 in this embodiment, the frequency of impingement of ions is low and accordingly the anisotropy of etching is low.

After the etching process for a predetermined time period, the generation of the plasma is stopped and the gas within the container 62 is replaced with an inert gas. In an order reverse to the above, the processed wafer W is taken out of the container 62 by the transfer device 42 and transferred into the cassette C from which the wafer W was taken out or into the empty cassette C.

When one of the magnets 112a to 112c of the processing chambers 14a to 14c is rotated, the other two are forcibly rotated synchronously without fail. Specifically, the magnets 112a to 112c are forcibly rotated synchronously by signals from the controller 52 not only when the etching is being performed in all processing chambers 14a to 14c but also when only one of the processing chambers 14a to 14c is used. During the synchronous rotation, the directions of the magnets 112a to 112c are always the same, as shown in FIG. 5 by symbols θA and θB. In other words, the N-S axes of the magnets 112a to 112c are always parallel in the same plane.

If the magnets 112a to 112c are synchronously rotated, the influence among magnetic fields of the processing chambers 14a to 14c is stabilized and disturbance of magnetic field generated in the container 62 of each of the processing chambers 14a to 14c is curbed. Specifically, the magnetic field generated in the container 62 is set off from the magnetic field generated by the magnet 112 and accompanying sub-magnet 114 alone. However, the absolute value of off-set is low and stable. Even if the absolute value varies, the variation is very regular. If necessary, the system may be designed in consideration of the off-set in advance. Accordingly, the magnetic field generated in the container 62 is stabilized, it is possible to prevent variation in density of plasma generated above the wafer W and non-uniformity of density. Furthermore, no irregular behavior of leak magnetic field from the system to the outside occurs and adverse affect on peripheral electronic devices decreases.

Experiments were made by using two processing chambers arranged such that the distance between the centers of the magnets is about 110 cm. In a first case, the two magnets were synchronous rotated with the N-S axes being set in parallel. In a second case, one of the magnets alone was rotated. It was found that in the case where the two magnets were synchronously rotated, the degree of irregular behavior of leak magnetic field from the system to the outside was low and adverse affect upon peripheral electronic devices was small.

Figure 6:
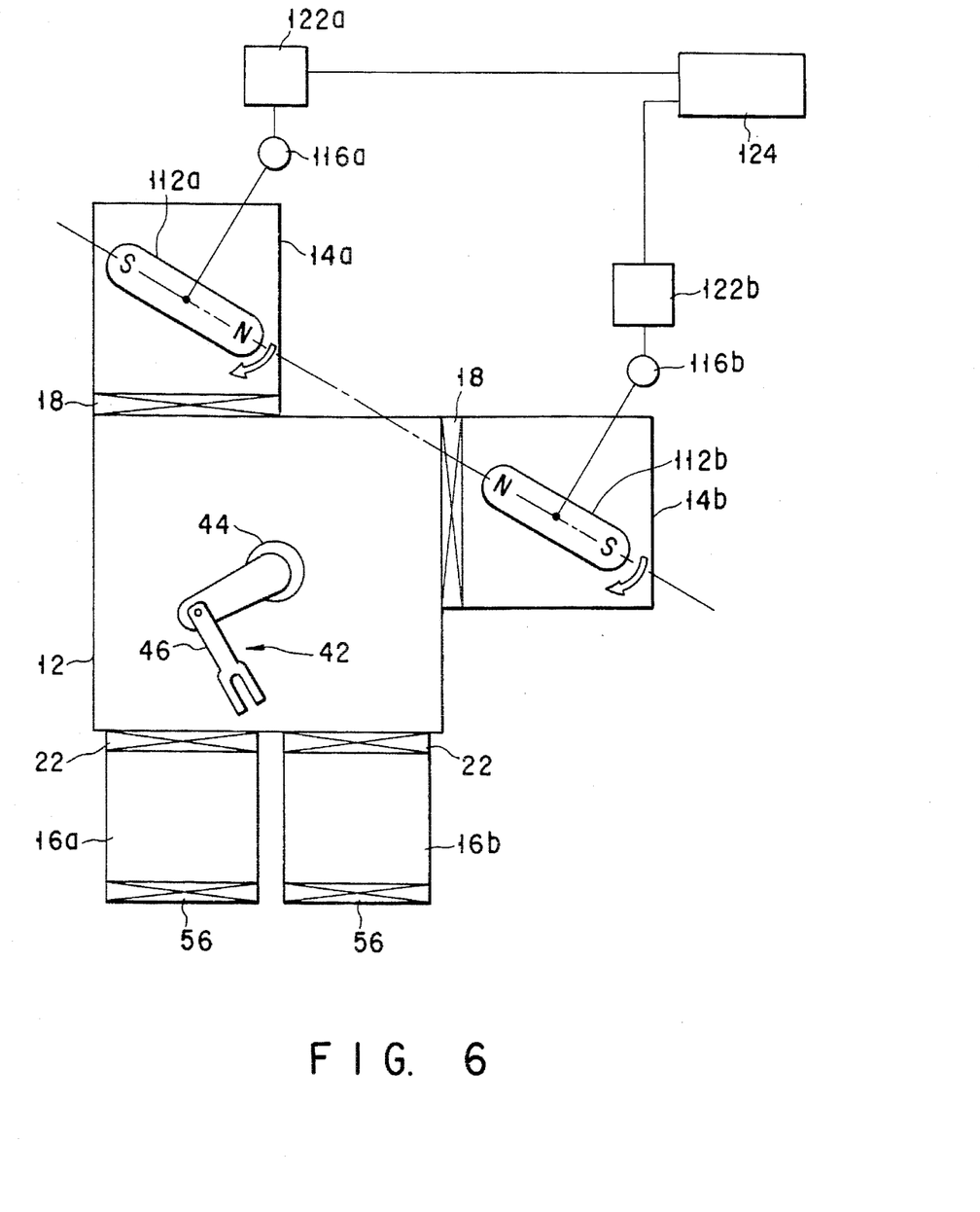
FIG. 6 is a plan view showing schematically a system according to a second embodiment of the invention.
Figure 7:
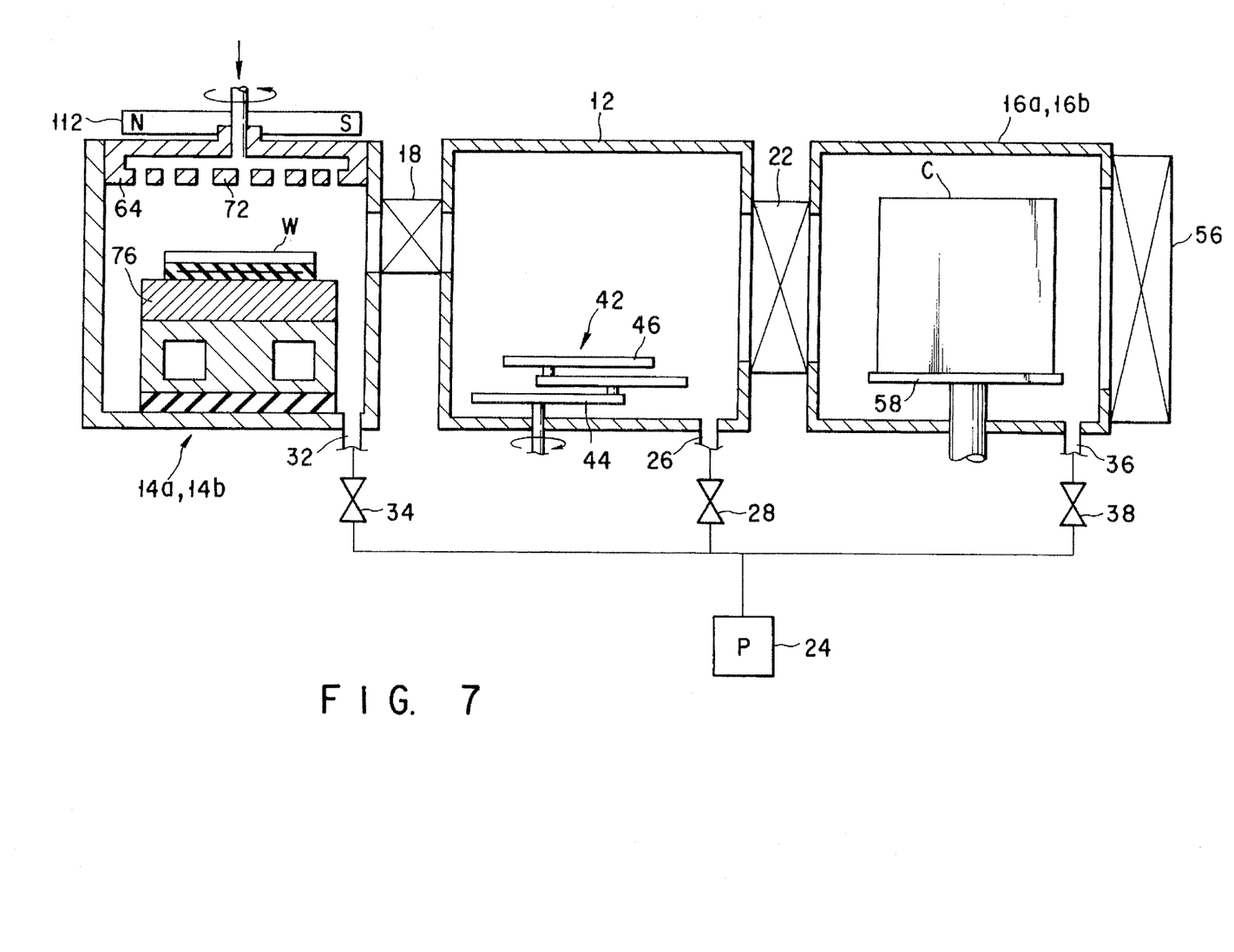
FIG. 7 is a cross-sectional view showing the relationship between a transfer chamber, one processing chamber and one cassette chamber of the system as shown in FIG. 6.
Figure 8:
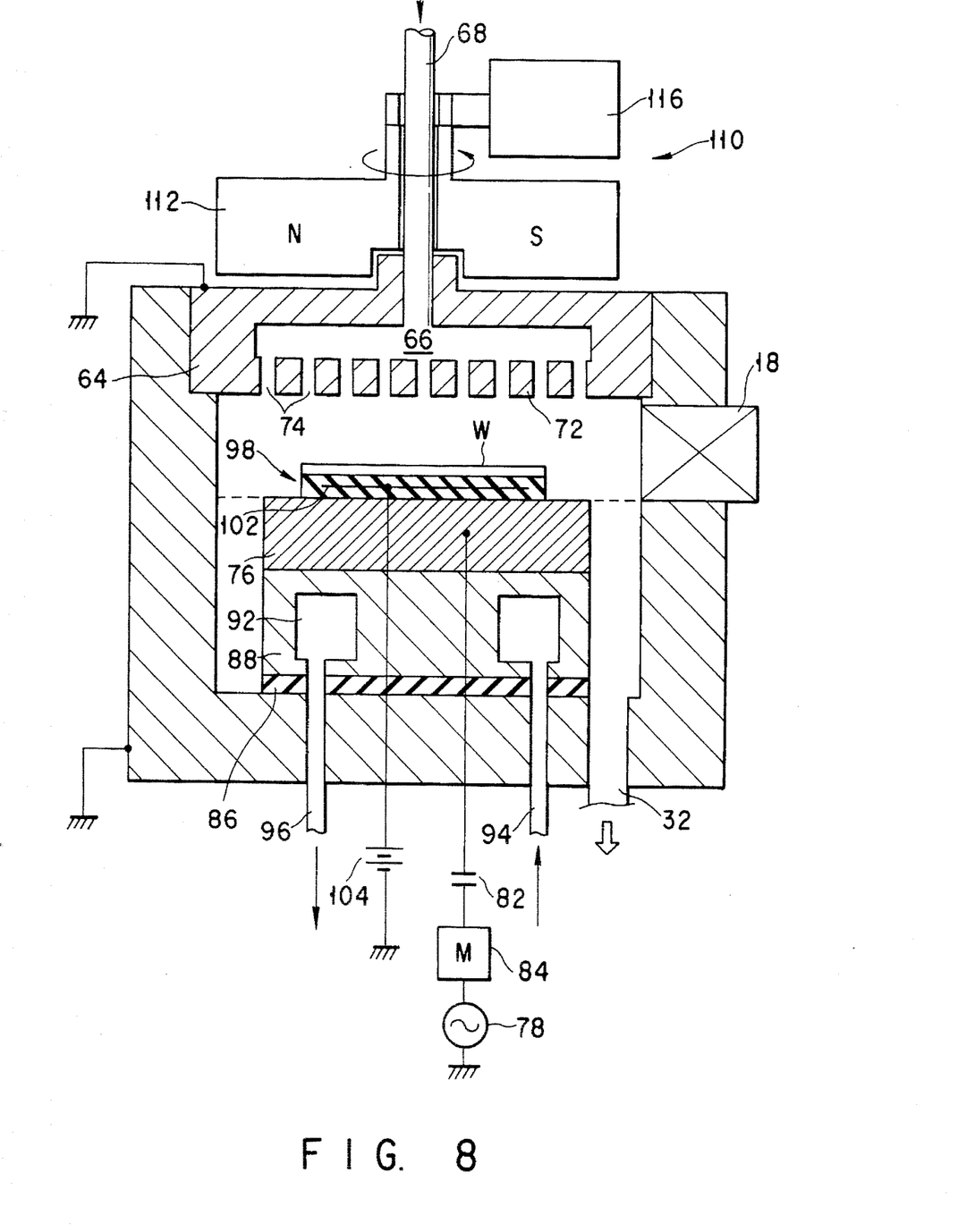
FIG. 8 is a cross-sectional view showing the processing chamber of the system as shown in FIG. 6.

FIGS. 6 to 8 show a magnetron RIE system according to a second embodiment of the present invention. The parts common to those in the first embodiment as shown in FIGS. 1 to 5 are denoted by the same reference numerals, and a description will be given only where necessary.

In this embodiment, two vacuum processing chambers 14a and 14b and two cassette chambers 16a and 16b are connected to a transfer chamber 12.

As is shown in FIGS. 6 and 7, each of the cassette chambers 16a and 16b is not provided with an upper opening and a swingable cover 54, unlike the first embodiment. Instead, an opening for introducing and taking out the cassette C and a gate valve 56 for airtightly closing the opening are provided at the side wall of each cassette chamber 16a, 16b opposing the connection path with the transfer chamber 12. A turntable 58 for supporting the cassette C is disposed within each cassette chamber 16a, 16b. This structure is suitable to the case where the cassette C is introduced into each cassette chamber 16a, 16b by a transfer robot (not shown).

As is shown in FIGS. 7 and 8, an introducing pipe 68 for introducing a process gas into the vacuum container 62 of each processing chamber 14a, 14b is connected to a center portion of a gas supply head 64. A permanent rod magnet 112 for generating a magnetic field of, e.g. 10 to 1000 Gauss between upper and lower electrodes 72 and 76 is situated such that the rotational axis of the rod magnet 112 coincides with that of the introducing pipe 68. Unlike the first embodiment, a sub-magnet 114 for preventing leak of magnetic field is not provided.

In FIG. 6, the main magnet 112 and motor 116 are denoted by reference numerals 112a, 112b and 116a, 116b corresponding to the respective processing chambers 14a and 14b. The respective motors 116a and 116b are connected to driving circuits 122a and 122b which are in turn connected to a controller 124. Sync signals are output from the controller 124 to the driving circuits 122a and 122b. In response to the sync signals, the driving circuits 122a and 122b rotate forcibly the motors 116a and 116b at an equal speed, e.g. 20 rpm, in synchronism. As is shown in FIG. 6, the main magnets 112a and 112b are initially set such that N-S axes of magnetic fields are parallel and opposite to each other in the same plane. Since the main magnets 112a and 112b are synchronously rotated in the same plane at equal speed, the N-S axes of the magnetic fields thereof are always parallel and opposite in the same plane.

When one of the magnets 112a and 112b of the processing chambers 14a and 14b is rotated, the other is always forcibly rotated synchronously. In other words, the magnets 112a and 112b are forcibly rotated in a synchronous manner not only when the etching is being performed in both processing chambers 14a and 14b but also when one of the processing chambers 14a and 14b is used. During the synchronous rotation, the directions of the magnets 112a and 112b are always opposite. That is, the N-S axes of the magnetic fields thereof are always parallel and opposite to each other in the same plane.

If the magnets 112a and 112b are synchronously rotated, the influence among magnetic fields of the processing chambers 14a and 14b is stabilized, as mentioned above, and disturbance of magnetic field generated in the container 62 of each processing chamber 14a and 14b is curbed. In addition, since the magnetic fields generated by the magnets 112a and 112b are always oriented in opposite directions to cancel each other, no irregular behavior of leak magnetic field from the system to the outside occurs, and, furthermore, the absolute value of the intensity of leak magnetic field decreases. Therefore, according to the second embodiment, adverse affect upon the peripheral electronic devices decreases.

Figure 9:
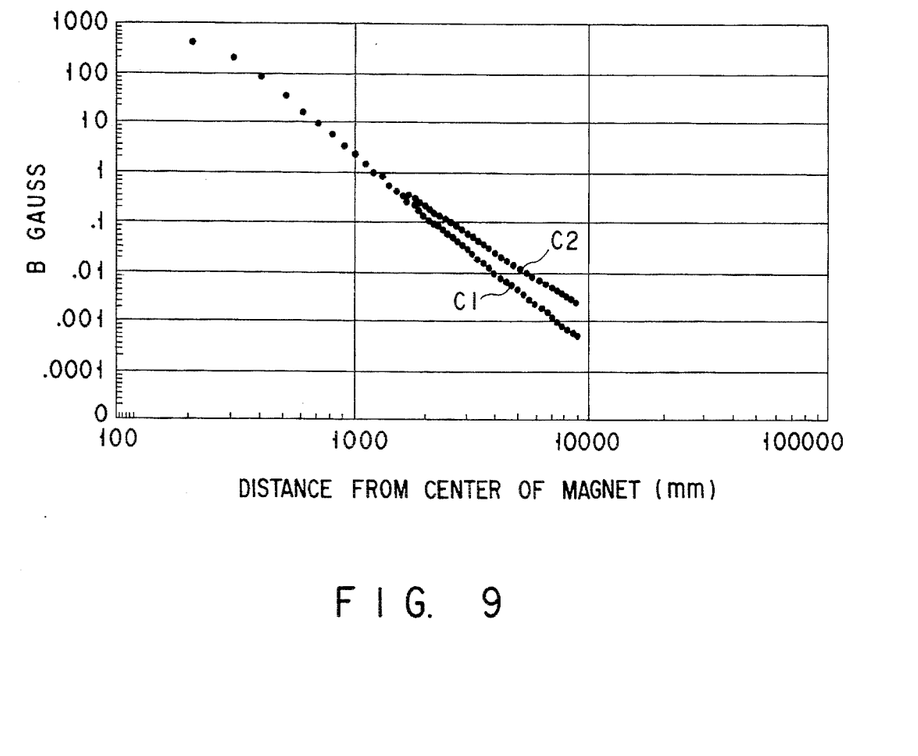
FIG. 9 is a graph showing leak magnetic fields.

Experiments were made by using two processing chambers arranged such that the distance between the centers of the magnets is about 110 cm. In a first case C1, the two magnets were synchronous rotated with the N-S axes being set in the same direction. In a second case C2, the two magnets were synchronous rotated with the N-S axes being set in the opposite directions. FIG. 9 shows the results of the experiments. The abscissa indicates a distance from the center of the magnet 112a in a direction passing through the center of the magnet 112b, and the ordinate indicates the intensity (Gauss) of magnetic field. From FIG. 9, it is found that the intensity of leak magnetic field is less in the case C1 in the present embodiment.

In the system of the second embodiment, a magnetic sensor and a magnetic field generating member such as an electromagnet or a rotational permanent magnet may be situated outside the processing chambers 14a and 14b, in particular, on the side where electronic devices are present. In this case, by driving the magnetic field generating member on the basis of a detection signal from the magnetic sensor, the intensity of leak magnetic field from the system to the outside can be further decreased. In case the intensity of leak magnetic field increases due to an accident, the increase can be automatically compensated.

In the first and second embodiments, the permanent magnet 112 and the motor 116 for rotating the permanent magnet 112 are used as members for generating the rotating magnetic field between the upper and lower electrodes 72 and 76. This structure may be replaced with a structure wherein a plurality of electromagnets are provided around the container 62 and AC voltages in different phases are applied to the electromagnets, respectively, thereby to generate a rotating magnetic field between the upper and lower electrodes 72 and 76. In this structure, as in the first embodiment, the magnetic fields of the processing chambers can be rotated synchronously with the directions of the N-S axes being set to be identical. Furthermore, as in the second embodiment, the magnetic fields of the processing chambers can be rotated synchronously with the directions of the N-S axes being set to be opposite to each other.

In the first and second embodiments, a plurality of magnetic fields are rotated at equal speed in the same plane such that the N-S axes thereof are set in the same direction or opposite directions. The advantage of the present invention, however, can be achieved to some extent if the N-S axes of a plurality of magnetic fields are rotated at equal speed at least in parallel planes.

Besides, typical target objects to be processed by the system of the present invention are LCD substrates in addition to semiconductor substrates. The present invention is applicable not only to an etching system but also to another processing system using magnetron discharge such as a CVD system, a sputtering system, or a system capable of performing two or more different processes.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A system for processing a target surface of a substrate using a plasma, said system comprising:

a container defining a vacuum processing space for storing and processing said substrate;

a supply system for introducing a gas into said container, said gas to be made into a plasma;

an exhaust system for exhausting said container;

a pair of counter electrodes facing each other within said container;

a support member, disposed within said container, for supporting said substrate such that said target surface is exposed to said processing space;

a power supply for applying a voltage between said counter electrodes, thereby generating an electric field;

a first magnet mechanism driven by a first motor for generating a first magnetic field between said counter electrodes, said first magnetic field having a N-S axis crossing said electric field and rotating;

a second magnet mechanism driven by a second motor for generating a second magnetic field in a separate second chamber having a rotating N-S axis, said first and second magnetic fields having parallel rotational planes; and a controller for controlling said first and second motors with respect to rotation of said first and second magnetic fields, such that when one of the first and second magnetic fields is rotated, the other is rotated at equal speed.

2. The system according to claim 1, wherein said first and second magnetic fields are rotated at equal speed such that the directions of the N-S axes of the first and second magnetic fields are parallel and identical.

3. The system according to claim 2, further comprising a third magnet mechanism driven by a third motor for generating a third magnetic field having a rotating N-S axis, wherein said first, second and third magnetic fields have parallel rotational planes, and said controller controls said third motor with respect to rotation of the third magnetic field, such that when one of the first, second and third magnetic fields is rotated, the other two magnetic fields are rotated at equal speed.

4. The system according to claim 2, wherein said rotational planes of said first and second magnetic fields are located in the same plane.

5. The system according to claim 1, wherein said first and second magnetic fields are rotated at equal speed such that the directions of the N-S axes of the first and second magnetic fields are parallel and opposite to each other.

6. The system according to claim 5, wherein said rotational planes of said first and second magnetic fields are located in the same plane.

7. A system for processing target surfaces of first and second substrates using a plasma, said system comprising:

a first container defining a vacuum processing space for storing and processing said first substrate;

a supply system for introducing a gas into said first container, said gas to be made into a plasma;

an exhaust system for exhausting said first container;

a pair of first counter electrodes facing each other within said first container;

a support member, disposed within said first container, for supporting said first substrate such that said target surface is exposed to said processing space;

a power supply for applying a voltage between said first counter electrodes, thereby generating a first electric field;

a first magnet mechanism driven by a first motor for generating a first magnetic field between said first counter electrodes, said first magnetic field having a N-S axis crossing said first electric field and rotating;

a second container defining a vacuum processing space for storing and processing said second substrate;

a supply system for introducing a gas into said second container, said gas to be made into a plasma;

an exhaust system for exhausting said second container;

a pair of second counter electrodes facing each other within said second container;

a support member, disposed within said second container, for supporting said second substrate such that said target surface is exposed to said processing space;

a power supply for applying a voltage between said second counter electrodes, thereby generating a second electric field;

a second magnet mechanism driven by a second motor for generating a second magnetic field between said second counter electrodes, said second magnetic field having a N-S axis crossing said second electric field and rotating, said first and second magnetic fields having parallel rotational planes; and a controller for controlling said first and second motors with respect to rotation of said first and second magnetic fields, such that when one of the first and second magnetic fields is rotated, the other is rotated at equal speed.

8. The system according to claim 7, wherein said first and second magnetic fields are rotated at equal speed such that the directions of the N-S axes of the first and second magnetic fields are parallel and identical.

9. The system according to claim 8, further comprising a third magnet mechanism driven by a third motor for generating a third magnetic field having a rotating N-S axis, wherein said first, second and third magnetic fields have parallel rotational planes, and said controller controls said third motor with respect to rotation of the third magnetic field, such that when one of the first, second and third magnetic fields is rotated, the other two magnetic fields are rotated at equal speed.

10. The system according to claim 8, wherein said rotational planes of said first and second magnetic fields are located in the same plane.

11. The system according to claim 7, wherein said first and second magnetic fields are rotated at equal speed such that the directions of the N-S axes of the first and second magnetic fields are parallel and opposite to each other.

12. The system according to claim 11, wherein said rotational planes of said first and second magnetic fields are located in the same plane.

13. The system according to claim 7, wherein each of said first and second magnet mechanisms has a main magnet and a sub-magnet fixed to each other and rotated as one unit, said main magnet and sub-magnet are arranged such that the directions of N-S axes thereof are opposite to each other, and said main magnet is located closer to the associated processing space.

14. A system for processing target surfaces of first and second substrates using a plasma, said system comprising:

a transfer chamber capable of forming a reduced-pressure atmosphere therein;

a transfer device, arranged within said transfer chamber, for transferring said first and second substrates;

a first container defining a vacuum processing space for storing and processing said first substrate, said first container being connected to said transfer chamber via a gate;

a supply system for introducing a gas into said first container, said gas to be made into a plasma;

an exhaust system for exhausting said first container;

a pair of first counter electrodes facing each other within said first container;

a support member, disposed within said first container, for supporting said first substrate such that said target surface is exposed to said processing space;

a power supply for applying a voltage between said first counter electrodes, thereby generating a first electric field;

a first magnet mechanism driven by a first motor for generating a first magnetic field between said first counter electrodes, said first magnetic field having a N-S axis crossing said first electric field and rotating;

a second container defining a vacuum processing space for storing and processing said second substrate, said second container being connected to said transfer chamber via a gate;

a supply system for introducing a gas into said second container, said gas to be made into a plasma;

an exhaust system for exhausting said second container;

a pair of second counter electrodes facing each other within said second container;

a support member, disposed within said second container, for supporting said second substrate such that said target surface is exposed to said processing space;

a power supply for applying a voltage between said second counter electrodes, thereby generating a second electric field;

a second magnet mechanism driven by a second motor for generating a second magnetic field between said second counter electrodes, said second magnetic field having a N-S axis crossing said second electric field and rotating, said first and second magnetic fields having parallel rotational planes; and a controller for controlling said first and second motors with respect to rotation of said first and second magnetic fields, such that when one of the first and second magnetic fields is rotated, the other is rotated at equal speed.

15. The system according to claim 14, wherein said first and second magnetic fields are rotated at equal speed such that the directions of the N-S axes of the first and second magnetic fields are parallel and identical.

16. The system according to claim 15, further comprising a third magnet mechanism driven by a third motor for generating a third magnetic field having a rotating N-S axis, wherein said first, second and third magnetic fields have parallel rotational planes, and said controller controls said third motor with respect to rotation of the third magnetic field, such that when one of the first, second and third magnetic fields is rotated, the other two magnetic fields are rotated at equal speed.

17. The system according to claim 15, wherein said rotational planes of said first and second magnetic fields are located in the same plane.

18. The system according to claim 14, wherein said first and second magnetic fields are rotated at equal speed such that the directions of the N-S axes of the first and second magnetic fields are parallel and opposite to each other.

19. The system according to claim 18, wherein said rotational planes of said first and second magnetic fields are located in the same plane.

20. The system according to claim 14, wherein each of said first and second magnet mechanisms has a main magnet and a sub-magnet fixed to each other and rotated as one unit, said main magnet and sub-magnet are arranged such that the directions of N-S axes thereof are opposite to each other, and said main magnet is located closer to the associated processing space.

* * * * *